(12) United States Patent
Nakamura et al.

(10) Patent No.: US 7,749,592 B2
(45) Date of Patent: Jul. 6, 2010

(54) MULTILAYER CERAMIC SUBSTRATE

(75) Inventors: Tomoko Nakamura, Tokyo (JP); Katsuhiko Igarashi, Tokyo (JP)

(73) Assignee: TDK Corpoation, Tokyo (JP)

( * ) Notice: Subject to any disclaimer, the term of this patent is extended or adjusted under 35 U.S.C. 154(b) by 474 days.

(21) Appl. No.: 11/702,542

(22) Filed: Feb. 6, 2007

(65) Prior Publication Data

US 2008/0188366 A1 Aug. 7, 2008

(51) Int. Cl.
*B32B 9/00* (2006.01)
*H05K 1/11* (2006.01)

(52) U.S. Cl. .................. 428/210; 428/209; 174/258; 174/264; 361/803

(58) Field of Classification Search ......... 428/209–210; 174/255–258, 264; 361/803
See application file for complete search history.

(56) References Cited

U.S. PATENT DOCUMENTS

| | | | | | |
|---|---|---|---|---|---|
| 4,875,136 | A | * | 10/1989 | Sano et al. | 361/321.3 |
| 5,456,778 | A | * | 10/1995 | Fukuta et al. | 156/89.17 |
| 5,785,879 | A | * | 7/1998 | Kawamura et al. | 216/95 |
| 5,855,711 | A | * | 1/1999 | Araki et al. | 156/89.16 |
| 6,110,569 | A | * | 8/2000 | Igarashi | 428/210 |
| 6,413,620 | B1 | * | 7/2002 | Kimura et al. | 428/210 |
| 6,414,247 | B1 | * | 7/2002 | Nakai et al. | 174/257 |
| 7,481,953 | B2 | * | 1/2009 | Tanaka et al. | 252/514 |

FOREIGN PATENT DOCUMENTS

| | | |
|---|---|---|
| JP | H05-047209 | 2/1993 |
| JP | H06-069651 | 3/1994 |
| JP | H08-186049 | 7/1996 |
| JP | H10-075060 | 3/1998 |
| JP | 2003-133745 | 5/2003 |
| JP | 2004-055554 | 2/2004 |
| JP | 2004-319116 | 11/2004 |
| JP | 2005-216998 | 8/2005 |

* cited by examiner

*Primary Examiner*—Cathy Lam
(74) *Attorney, Agent, or Firm*—Manabu Kanesaka

(57) ABSTRACT

A multilayer ceramic substrate includes a plurality of stacked glass ceramic layers and internal conductors. The glass ceramic layers contain at least one diffusion element selected from the group consisting of Ti, Zr and Mn. The internal conductors contain Ag as a conductive material. The multilayer ceramic substrate is produced by the steps of adding at least one diffusion element selected from the group consisting of Ti, Zr and Mn to conductive paste and diffusing the diffusion element in the glass ceramic layers around the conductive paste. As a result, defects otherwise possibly generated around the internal conductors can be eliminated with exactitude.

4 Claims, 5 Drawing Sheets

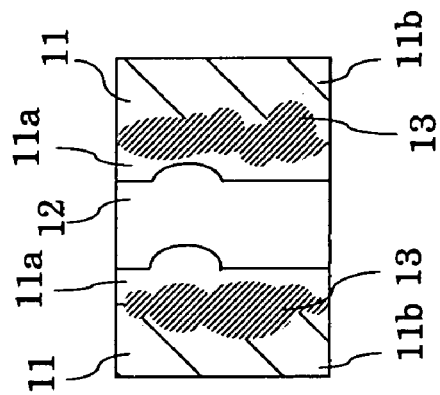
Fig. 1
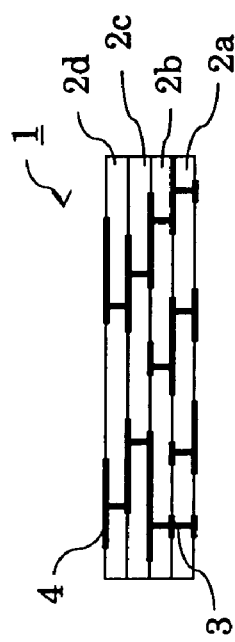
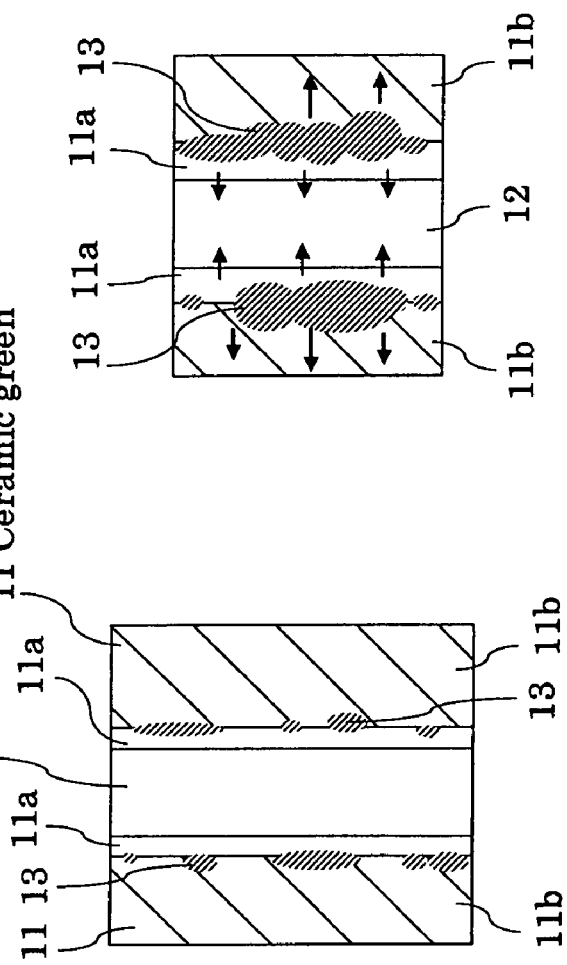
Fig. 2(a)
Fig. 2(b)
Fig. 2(c)

MULTILAYER CERAMIC SUBSTRATE

BACKGROUND OF THE INVENTION

1. Field of the Invention

The present invention relates to a multilayer ceramic substrate having internal conductors such as via-hole conductors, for example, and particularly to a technique of preventing the generation of defects around the internal conductors.

2. Description of the Prior Art

While a substrate for mounting an electronic device thereon has been put to extensive use in the fields of electronics etc., multilayer ceramic substrates have been proposed and put to practical use as highly reliable substrates in reply to recent demands for making electronics small-sized, lightweight and multifunctional. The multilayer ceramic substrate comprises a plurality of ceramic layers stacked and has wiring conductors or electronic elements incorporated integrally into each ceramic layer to achieve high-density mounting.

The multilayer ceramic substrate can be obtained through the steps of stacking a plurality of green sheets to form a multilayer body and firing the multilayer body. The green sheet always shrinks as accompanied by sintering in the firing step. This is a serious cause in decreasing the dimensional accuracy of the multilayer ceramic substrate. To be concrete, a shrinkage variation arises as accompanied by the shrinkage and, in the multilayer ceramic substrate being obtained finally, the dimensional accuracy falls around 0.5%.

Under these circumstances, a so-called non-shrinkage firing process capable of suppressing the shrinkage in the in-plane direction and shrinking only in the thickness direction of the green sheets in the firing step of the multilayer ceramic substrate was proposed (refer to JP-A HEI 10-75060, for example). As described in the prior art, when a multilayer body of green sheets having attached thereto a sheet not shrinkable even at the temperature in the firing step is fired, the shrinkage in the in-plane direction is suppressed and only the shrinkage in the thickness direction is produced. According to this process, the dimensional accuracy in the in-plane direction of a multilayer ceramic substrate can be improved to stay at around 0.05%, for example.

Incidentally, the formation of internal conductors for implementing interlayer connection, such as via-hole conductors, is indispensable to a multilayer ceramic substrate. When fabricating the multilayer ceramic substrate, a firing step is taken, with conductive paste filled in via holes formed. In this case, it has been known to the art that pores (defects) are produced around the internal conductors (via-hole conductors, for example) by dint of the difference in thermally shrinking behavior between the conductive paste and the green sheets. The generation of such defects arises copiously, particularly in the non-shrinkage firing process.

Therefore, techniques of eliminating these defects have been studied in various fields (refer to JP-A 2003-133745 and Japanese Patent Nos. 2732171 and 3589239, for example). The invention described in JP-A 2003-133745 uses a conductive composition for a multilayer ceramic substrate containing conductive powder, such as of Ag, and an Mo compound or Mo metal as a conductive composition to be filled in via holes to enable the production of a multilayer ceramic substrate giving rise to no defect in the vicinity of electrodes after being fired. Similarly, in the invention described in Japanese Patent No. 2732171, a via-hole conductor is formed of Ag and W to attempt not to generate any pore between the via-hole conductor and the inner wall of the via hole. The invention described in Japanese Patent No. 3589239 uses as a conductive component of conductive paste conductive powder coated with a metal oxide to elevate the shrinkage-starting temperature of the conductive paste, thereby trying not to generate any stress that possibly restrains shrinkage during the shrinkage of a compacted ceramic body by firing.

According to the repeated studies by the present inventors, however, it has been found that satisfactory results cannot always be obtained only from the control of the shrinking behavior of the conductive paste for forming the internal conductors as disclosed in each of the prior art references and in particular that the generation of the defects around the internal conductors cannot sufficiently be suppressed in the case of fabricating a multilayer ceramic substrate using the non-shrinkage firing process. In addition, in the case of covering the surface of the conductive powder with a metal oxide as disclosed in Japanese Patent No. 3589239, for example, there is a possibility of an increase in electric resistance of the internal conductors becoming conspicuous.

The present invention has been proposed in view of the conventional state of affairs, and the object thereof is to enable infallible elimination of possible generation of defects around the internal conductors of the multilayer ceramic substrate and thereby to provide a highly reliable multilayer ceramic substrate and a production method thereof.

To attain the above object, the present inventors have been made various studies continuously over a long period of time and, as a result, have come to a conclusion that diffusion of Ti, Zr and/or Mn around the internal conductors enables the generation of the defects to be effectively suppressed. The present invention has been perfected based on this knowledge.

SUMMARY OF THE INVENTION

The present invention provides a multilayer ceramic substrate comprising a plurality of stacked glass ceramic layers and internal conductors, at part of internal conductors at least regions of the glass ceramic layers around the internal conductors contain at least one diffusion element which is selected from the group consisting of Ti, Zr and Mn and which has a content larger at regions of the glass ceramic layers around the internal conductors than at different regions of the glass ceramic layers.

The present invention further provides a method for producing a multilayer ceramic substrate, comprising the steps of adding at least one diffusion element selected from the group consisting of Ti, Zr and Mn to conductive paste, forming a conductive pattern formed of the conductive paste on and/or in at least part of a plurality of glass ceramic green sheets, stacking the glass ceramic green sheets to form a stacked body, firing the stacked body and diffusing the diffusion element in the glass ceramic green sheets around the conductive pattern during the step of firing.

It has been conceived that during a firing step to produce a multilayer ceramic substrate having internal conductors, defects are generated due to the difference in thermal shrinkage between the internal conductors and glass ceramic layers (glass ceramic green sheets). Therefore, the conventional techniques have focused on elimination of the difference in thermal shrinkage between the internal conductors and the glass ceramic layers. However, as a result of the detailed studies made by the present inventors, it has been found that the internal conductors (such as of silver) are diffused in the glass ceramic layers to lower the sintering-starting temperature of the regions thereof in which the internal conductors have been diffused and therefore that the difference in thermal shrinkage between the regions and other regions generates the defects.

In the present invention, at least one species selected from the group consisting of Ti, Zr and Mn is diffused in the glass ceramic layers around the internal conductors to eliminate a decrease in sintering-starting temperature by dint of the diffusion of silver etc. Therefore, in the multilayer ceramic substrate of the present invention, since elimination of the difference in sintering-starting temperature of the glass ceramic layers around the internal conductors can be achieved to suppress the generation of pores resulting from the time sintering starts at regions of the glass ceramic layers around the internal conductors that is earlier than the time sintering starts at other regions of the glass ceramic layers. Incidentally, when Mo and W are added to the via-hole conductors as disclosed in JP-A 2003-133745 and Japanese Patent No. 2732171, it is conceivable that the Mo and W are diffused around the internal conductors. Even when the Mo and W have been diffused around the internal conductors, however, a decrease in sintering-starting temperature due to the diffusion of Ag cannot be eliminated, and the generation of pores resulting from the decrease cannot sufficiently be suppressed.

According to the present invention, it is made possible to suppress the generation of pores by dint of a difference in sintering-starting temperature among the glass ceramic layers in the vicinity of the internal conductors and infallibly eliminate pores otherwise generated around the internal conductors. Thus, the present invention makes it possible to provide a highly reliable multilayer ceramic substrate with no pore.

The above and other objects, characteristic features and advantages of the present invention will become apparent to those skilled in the art from the description to be given herein below with reference to the accompanying drawings.

BRIEF DESCRIPTION OF THE DRAWINGS

FIG. 1 is a schematic cross section showing one example of a multilayer ceramic substrate.

FIG. 2(a) through FIG. 2(c) are explanatory views showing a mechanism of generating defects.

DETAILED DESCRIPTION OF THE PREFERRED EMBODIMENTS

Figure 3:
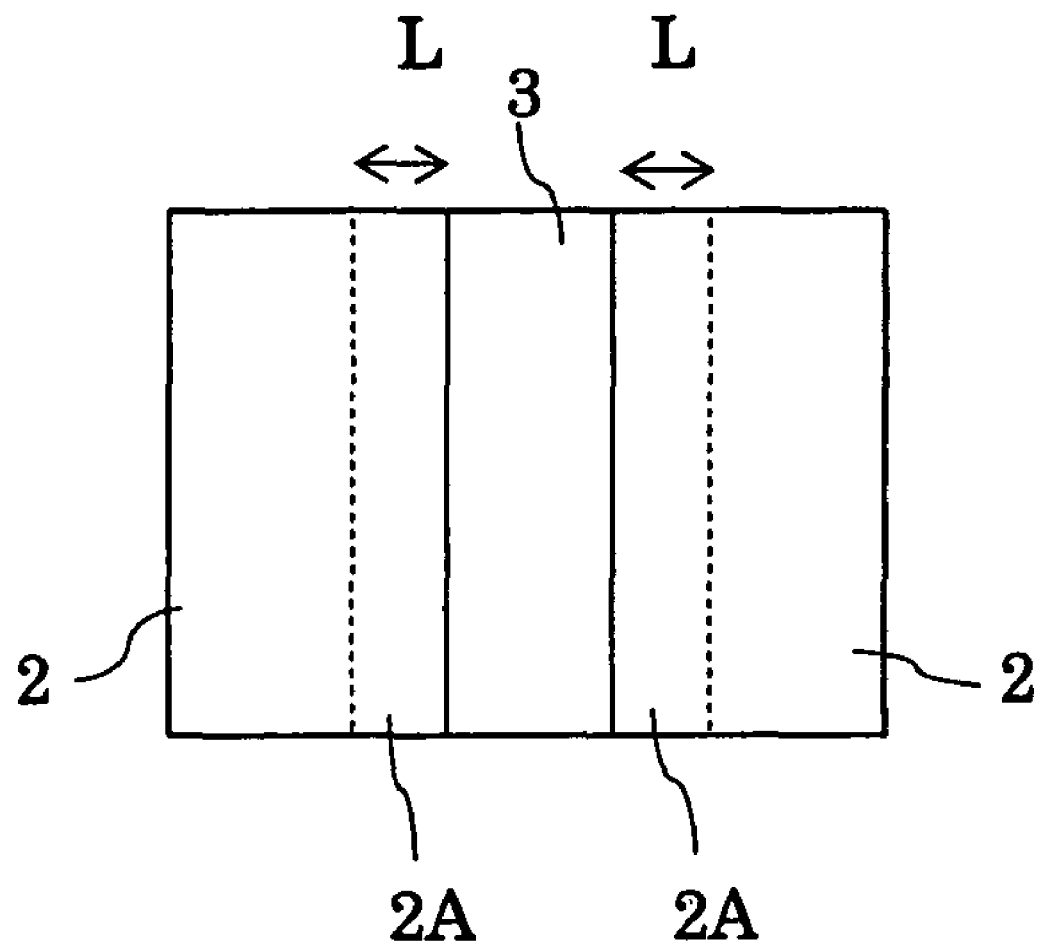
FIG. 3 is a schematic view showing a state wherein diffusion elements have been diffused around a via-hole conductor.

A multilayer ceramic substrate and a production method thereof according to the present invention will now be described in detail with reference to the accompanying drawings.

As shown in FIG. 1, a multilayer ceramic substrate 1 comprises a plurality of stacked glass ceramic layers 2 (here, four layers 2a to 2d) and internal conductors that include via-hole conductors 3 piercing through the glass ceramic layers 2a to 2d and surface conductors 4 formed on the opposite surfaces of the glass ceramic layers 2a to 2d.

Each of the glass ceramic layers 2a to 2d is formed by sintering a composite oxide of a prescribed glass composition added with alumina ($Al_2O_3$) etc. Examples of an oxide constituting the composite oxide having the glass composition include $SiO_2$, $B_2O_3$, CaO, SrO, BaO, $La_2O_3$, $ZrO_2$, $TiO_2$, MgO, ZnO, PbO, $Li_2O$, $Na_2O$ and $K_2O$, and these oxides are appropriately combined. The glass ceramic layers formed of any appropriate combination thereof enable execution of low-temperature firing.

On the other hand, of the internal conductors, the via-hole conductors 3 are produced in the form having a conductive material remaining in via holes formed in the glass ceramic layers 2a to 2d in consequence of firing of conductive paste in the via holes. The via-hole conductors 3 function to electrically connect the surface conductors 4 formed on the ceramic layers 2a to 2d and conduct heat. Though the via-hole conductors generally have a substantially circular cross section, this is not limitative. In order to acquire a large cross-sectional area within the range of a limited shape space, it is possible to adopt any optional shape including ellipse, oval or square, for example.

While each of the internal conductors including the via-hole conductors 3 and surface conductors 4 is formed in consequence of firing of conductive paste, when silver (Ag) has been contained as a conductive material, for example, it is diffused in the glass ceramic layers 2a to 2d during the firing step to induce a difference in sintering-starting temperature between the regions of the glass ceramic layers around the internal conductors and other regions of the glass ceramic layers.

In view of the above, the present invention causes at least one species selected from the group consisting of Ti, Zr an Mn to be diffused in the regions of the glass ceramic layers 2a to 2d around the internal conductors, thereby eliminating the difference in sintering-starting temperature.

FIG. 2 is an explanatory view showing the mechanism of defects being generated in the vicinity of the via-hole conductors 3. When a ceramic green body 11 which has via holes filled with conductive paste 12 and which after being fired constitutes the glass ceramic layers 2a to 2d has been fired, as shown in FIG. 2(a), Ag contained in the conductive paste is first diffused in regions 11a of the ceramic green body 11 around the conductive paste in connection with a temperature increase. The regions 11a of the ceramic green body in which the Ag has been diffused are lowered in sintering-starting temperature and start being sintered prior to other regions 11b of the ceramic green body 11. At this time, while the regions 11a are shrunk because sintering has started, the other regions 11b are not shrunk because sintering has not yet started. This difference in state between the regions 11a and 11b results in generation of pores 13.

A further increase in temperature induces that the other regions 11b of the ceramic green body 11 starts being sintered and, with this, retraction indicated by arrows directed outward as shown in FIG. 2(b) starts and shrinkage around the conductive paste 12 indicated by arrows directed inward is induced to enlarge the pores 13. As a result, large pores (defects) 13 are formed around the via-hole conductors 3 formed of sintered conductive paste at the completion of the sintering as shown in FIG. 2(c).

In view of the mechanism of generating these defects, it can be considered that suppression of the decrease in the sintering-starting temperature of the ceramic green body 11 around the conductive paste is effective. Ti, Zr or Mn is highly effective for suppressing the decrease in the sintering-starting temperature of the ceramic green body 11 and, therefore, diffusion thereof around the via-hole conductors 3 and surface conductors 4 can suppress the generation of defects.

FIG. 3 shows the state in which at least one diffusion element selected from the group consisting of Ti, Zr and Mn has been diffused in the glass ceramic layer 2 around the via-hole conductor 3 to form a diffusion region 2A. The diffusion elements diffused in the diffusion region 2A serve to suppress a decrease in sintering-starting temperature by dint of the Ag diffusion.

In this case, it is conceivable that the diffusion elements exist in the form of oxides, such as $TiO_2$, $ZrO_2$ and $MnO_2$. However, this is not limitative. The diffusion elements may be diffused in the glass ceramic layers even in any other form. Though the diffusion of the diffusion elements around the via-hole conductors has been described herein, it may be around the surface conductors 4. Preferably, it is around all the internal conductors including the via-hole conductors 3 and the surface conductors 4.

When the range of diffusion of the diffusion elements, specifically a diffusion distance L of the diffusion region 2A from the via-hole conductor 3 is unduly large, there is a possibility of the effect thereof being deteriorated. It is preferred that the distance L is approximately 100 μm or less. The content of the diffusion elements in the diffusion region 2A is in the range of 0.1 mass % to 50 mass %. When the content is less than 0.1 mass %, it will be impossible to sufficiently increase the sintering-starting temperature to possibly generate defects. Conversely, when the content is more than 50 mass %, the sintering-starting temperature of the ceramic green body around the internal conductors will become very high, resulting in sintering starting earlier at the region apart from the internal conductors than at the region around the internal conductors to also generate defects possibly.

Incidentally, there is a case where the diffusion elements are contained as constituent elements of the ceramic green body. In this case, the content of the diffusion elements in the region around the internal conductors is relatively larger than that in the other region. In this case, therefore, the prescribed content of the diffusion elements (0.1 mass % to 50 mass %) is the difference in content between the region around the internal conductors and the other region.

In order to disperse the diffusion elements in the glass ceramic layers around the internal conductors, as described above, the steps of adding the diffusion elements to the conductive paste for forming the internal conductors and firing the resultant mixture may be adopted. A method for producing the multilayer ceramic substrate 1 according to the present invention will now be described.

Figure 4A:
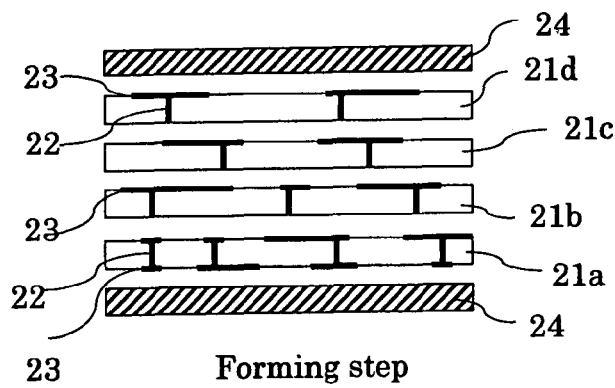
FIG. 4 is a schematic cross section showing the production method of a multilayer ceramic substrate, FIG. 4(a) showing a step of forming a glass ceramic green sheet and an internal conductor, FIG. 4(b) showing a temporary stacking step, FIG. 4(c) showing a pressing step, FIG. 4(d) showing a firing step and FIG. 4(e) showing a step of exfoliating a green sheet for shrinkage suppression.

The multilayer ceramic substrate can be produced by the following procedure. As shown in FIG. 4(a), glass ceramic green sheets 21a to 21d constituting the glass ceramic layers after being fired are first prepared. Powder of the aforementioned oxides and an organic vehicle are mixed to produce slurryed dielectric paste, and the paste is subjected to the doctor blade process to form on a support that is a polyethylene terephthalate (PET) sheet, for example, films as the glass ceramic green sheets 21a to 21d. Any of the conventionally known organic vehicles can be used as the organic vehicle for the present invention.

Through holes (via holes) are then formed at prescribed positions in the glass ceramic green sheets 21a to 21d thus formed. The via holes are generally circular holes, in which conductive paste 22 is filed to form via-hole conductors. Furthermore, a prescribed pattern of conductive paste is printed on the surface of each of the glass ceramic green sheets 21a to 21d to form a surface conductive pattern 23.

The conductive paste 22 filled in the via holes and the conductive paste used for the formation of the surface conductive pattern 23 are prepared through kneading of a conductive material formed of various kinds of conductive metals or alloys, such as Ag, Ag—Pd alloy, Cu and Ni, and an organic vehicle. Particularly when Ag is used, however, the problem on the generation of defects will be conspicuously posed. Therefore, when conductive paste containing Ag as the conductive material is adopted, the application of the present invention is made effective.

The organic vehicle in the conductive paste consists preponderantly of a binder and a solvent. Though the mixing ratios of the binder and solvent relative to the conductive material can optionally be determined, the mixing is performed so that 1 to 15 mass % of the binder and 10 to 50 mass % of the solvent relative to the conductive material may be established. The conductive paste may be added, when necessary, with an additive selected from the group consisting of various kinds of dispersants and plasticizer.

In the present invention, the diffusion elements (Ti, Zr and Mn) are further added to the conductive paste and diffused in the glass ceramic green sheets 21a to 21d at the time of firing. In this cases the diffusion elements to be added to the conductive paste may be in the form of either oxides thereof ($TiO_2$, $ZrO_2$ and $MnO_2$) or metals. The amount of the diffusion elements added to the conductive paste is preferably set so that the amount thereof diffused in the glass ceramic green sheets 21a to 21d may fall in the range mentioned above.

As described above, the diffusion elements are diffused in the glass ceramic green sheets 21a to 21d by adding the diffusion elements to the conductive paste. Another available procedure comprises applying paste containing the diffusion elements to the inner walls of the via holes and then filling conductive paste containing a conductive material in the via holes.

Figure 4B:
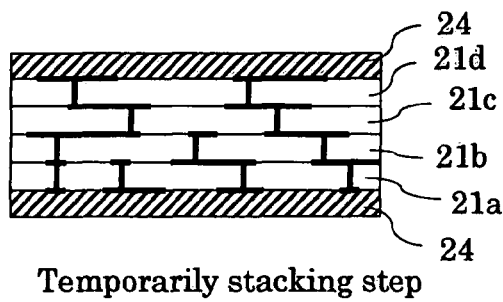

The conductive paste 22 that will constitute the internal conductors are filled in the glass ceramic green sheets 21a to 21d to form the surface conductors 23 and, as shown in FIG. 4(b), these sheets are stacked into a stacked body. At this time, on the opposite sides (outermost layers) of the stacked body, green sheets 24 for shrinkage suppression are disposed as restraint layers and firing is then performed.

Used as the green sheets 24 for shrinkage suppression is a composition containing a material unshrinkable at the firing temperature of the glass ceramic green sheets 21a to 21d, such as tridymite or cristobalite, and quarts, molten quartz, alumina, mullite, zirconia, aluminum nitride, boron nitride, magnesium oxide, silicon carbide, etc. Firing is performed, with the stacked body sandwiched between the green sheets 24 for shrinkage suppression, to enable shrinkage in the in-plane direction to be suppressed.

Figure 4C:
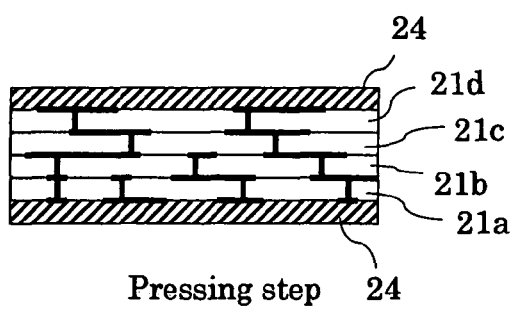
Figure 4D:
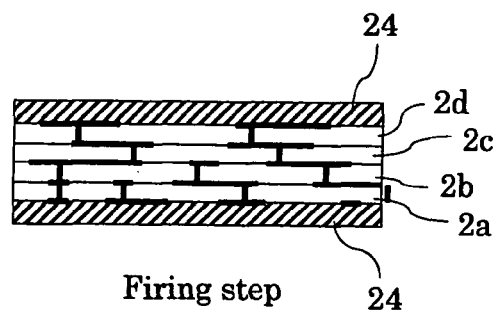

FIG. 4(b) shows a so-called temporarily stacked state of the stacked body. The stacked body in this state is pressed as shown in FIG. 4(c) and then fired as shown in FIG. 4(d). In the firing step, it is preferable to control the firing temperature, firing time, etc. so that the amount and distance of the diffusion elements to be diffused may be appropriate. After the firing step, the glass ceramic green sheets 21a to 21d constitute the glass ceramic layers 2a to 2d, respectively, and the conductive paste 23 in the via holes constitutes via-hole conductors 3. Similarly, the surface conductive pattern 24 constitutes the surface conductors 4.

Though the glass ceramic green sheets 21a to 21d are to be shrunk during the firing, since the restraining force of the green sheets 24 for shrinkage suppression acts greatly on the outermost glass ceramic green sheets 21a and 21d, little shrinkage occurs therein. On the other hand, since the glass ceramic green sheets 21b and 21c disposed at the center portion of the stacking direction are distant from the green sheets 24 for shrinkage suppression, the restraining force exerted thereon is small. Therefore, shrinkage occurs therein to some extent. As a result, defects, such as pores, are likely to be generated around the internal conductors, such as via-hole conductors 3. In the present invention, however, the diffusion elements are diffused from the conductive paste 23 and surface conductive pattern 24 in the glass ceramic green sheets 21a to 21d around them to suppress a decrease in sintering-starting temperature by dint of the diffusion of Ag that is a conductive material. Thus, the generation of defects, such as pores, can be suppressed with exactitude.

Figure 4E:
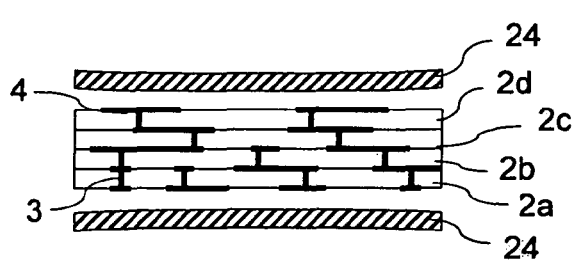

After the firing step, as shown in FIG. 4(e), the green sheets 24 for shrinkage suppression exfoliate spontaneously due to the difference in thermal expansion to obtain a multilayer ceramic substrate 1 of the present invention. The multilayer ceramic substrate 1 thus obtained has no defect generated around the internal conductors (via-hole conductors 3 and surface conductors 4) to enable a highly reliable multilayer ceramic substrate to be materialized.

Incidentally, the effect of preventing the generation of defects is greatly manifested in the case of the non-shrinkage firing in which firing is performed, with the green sheets 24 for shrinkage suppression disposed. However, also in the case of non-use of the green sheets for shrinkage suppression, a similar effect can be obtained.

Concrete examples of the present invention will be described based on experimental results.

In order to elucidate the mechanism of the generation of defects, the following experiment was conducted. To be specific, a glass ceramic green sheet was formed with a through hole in which conductive paste that would constitute a via-hole conductor was filled. The resultant body was fired. The glass ceramic green sheet had a material composition of 32.87 mass % of $SiO_2$, 2.19 mass % of $B_2O_3$, 44.53 mass % of $Al_2O_3$, 1.07 mass % of MgO, 1.98 mass % of CaO and 17.36 mass % of SrO. As conductive paste, that containing Ag was used. Firing was performed using the non-shrinkage firing process, with a green sheet containing α-quarts and tridymite for shrinkage suppression (restraint layer) disposed.

Figure 5:
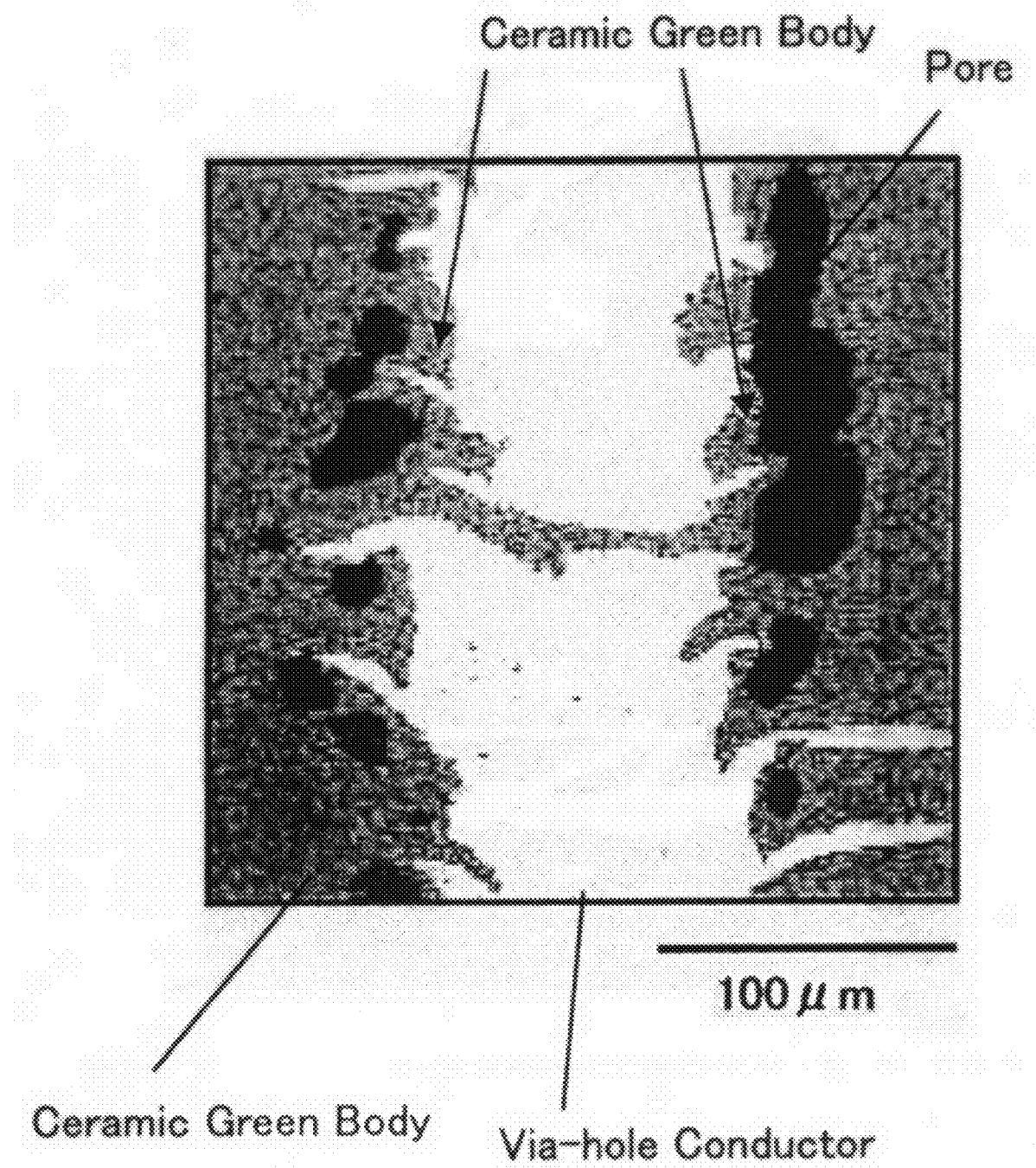
FIG. 5 a microgram showing a state in which defects have been generated in the vicinity of a via-hole conductor

FIG. 5 is a microgram showing the state in the vicinity of a via-hole conductor after the firing step. Though pores are formed around the via-hole conductor, the pores are formed not between the via-hole conductor and the ceramic green body. Actually, the ceramic green body exists between the via-hole conductor and the pores. In view of this point, the composition of the ceramic green body between the via-hole conductor and the pores was analyzed to find that it contained Ag diffused from the via-hole conductor.

Figure 6:
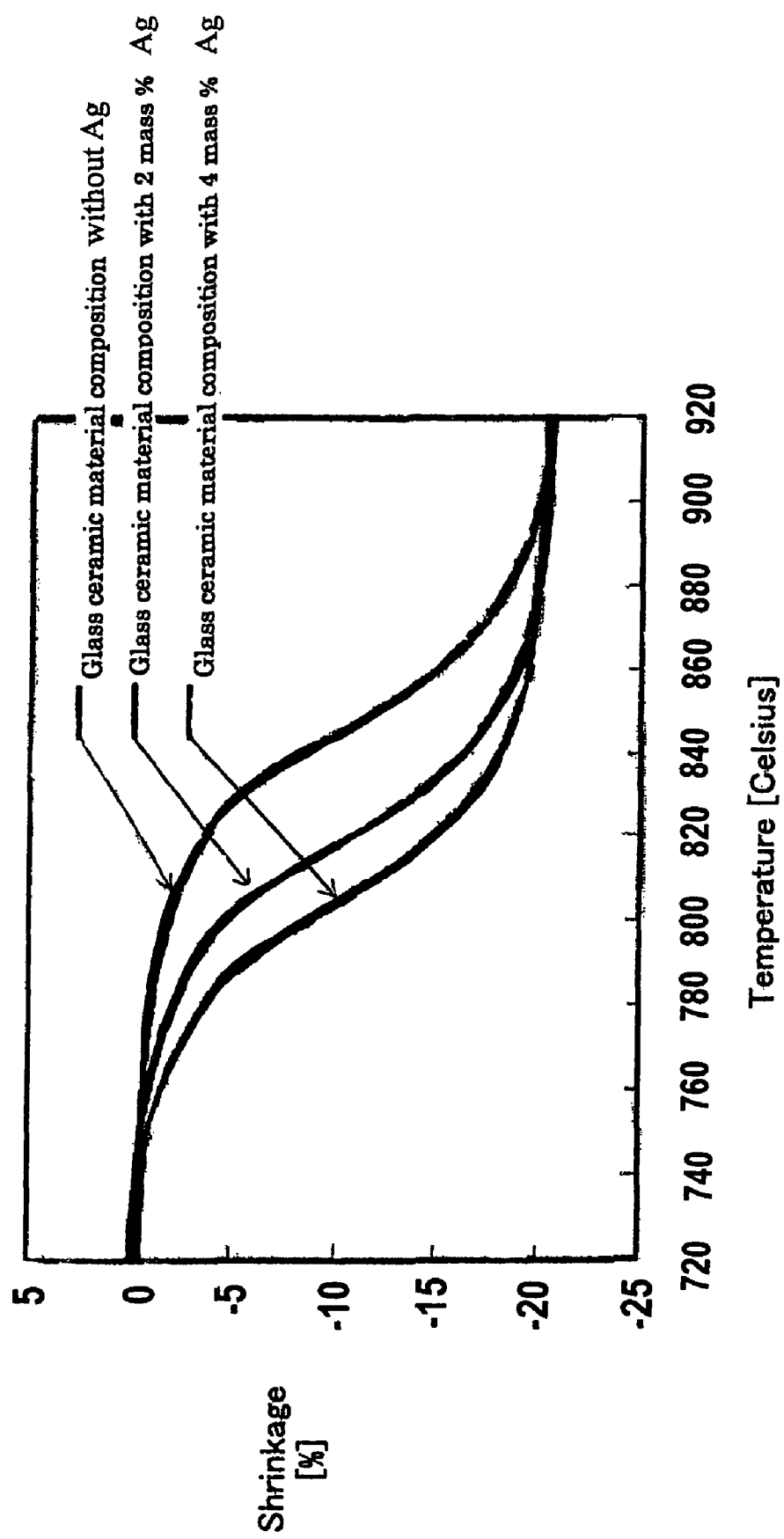
FIG. 6 is a characteristic diagram showing a variation in sintering-starting temperature due to the diffusion of Ag.

On the other hand, the test for the degree of shrinkage was made with respect to three samples, one being a glass ceramic material composition with no Ag, another being that with 2 mass % of Ag and the remaining one being that with 4 mass % of Ag. During the measurement of the degree of shrinkage, the shrinkage state was examined, with the temperature elevated gradually. The results are shown in FIG. 6. As was clear from FIG. 6, the addition of Ag allowed the shrinkage to start at low temperatures to find that the diffusion of Ag in the glass ceramic green body lowered the sintering-staring temperature.

It can be assumed from the measurement results that the difference in sintering-staring temperature between the region of the glass ceramic green body around the internal conductor and other regions of the glass ceramic green body is made and that the defects are generated in accordance with the mechanism shown in FIG. 2(a) to FIG. 2(c).

In order to confirm the effect obtained by diffusion of Ti, Zr or Mn, the following experiment was conducted. To be specific, conductive paste containing Ag as a conductive material was added with $TiO_2$, $ZrO_2$ and $MnO_2$ and then filled in a through hole formed in a glass ceramic green sheet having the same material composition as described above. The non-shrinkage firing process was used to perform firing, with green sheets for shrinkage suppression (restraint layers) disposed on the opposite sides of the glass ceramic green sheet. Both the diffused distance of the diffusion elements in the fired glass ceramic layer and the diffused content of the diffusion elements (distance L from the via-hole conductor) were measured, and the presence or absence of the defects was examined. Incidentally, since $ZrO_2$ was also contained in the material composition of the glass ceramic layer, the increment in the diffusion regions was measured. Furthermore, for the purpose of comparison, similar measurements in the case where $MoO_3$ and $WO_3$ were added to the conductive paste were performed. The results are shown in Table 1 below.

TABLE 1

| Sample No. | Element diffused | Content (mass %) | Distance from via hole conductor (μm) | Yes or No of presence of defects |
|---|---|---|---|---|
| 1 | $TiO_2$ | 0.1 | 1 | No |
| 2 | $TiO_2$ | 2 | 8 | No |
| 3 | $TiO_2$ | 30 | 79 | No |
| 4 | $TiO_2$ | 50 | 97 | No |
| 5 | $TiO_2$ | 61 | 98 | Yes |
| 6 | $TiO_2$ | 48 | 120 | Yes |
| 7 | $ZrO_2$ | 0.1 | 2 | No |
| 8 | $ZrO_2$ | 2 | 4 | No |
| 9 | $ZrO_2$ | 30 | 70 | No |
| 10 | $MnO_2$ | 0.1 | 1 | No |
| 11 | $MnO_2$ | 40 | 90 | No |
| 12 | $TiO_2$ $ZrO_2$ | 20 20 | 44 44 | No |
| 13 | $MoO_3$ | 2 | 7 | Yes |
| 14 | $MoO_3$ | 30 | 78 | Yes |
| 15 | $WO_3$ | 2 | 19 | Yes |
| 16 | $WO_3$ | 30 | 55 | Yes |
| 17 | $WO_3$ | 42 | 93 | Yes |

It is clear from Table 1 above that the diffusion of Ti, Zr or Mn in the glass ceramic layer enables the generation of the defects to be effectively suppressed. This effect cannot be obtained from the diffusion of Mo or W. It is noted, however, that when the diffusion distance or diffusion amount is unduly large in the case of the diffusion of Ti, the generation of the defects is not eliminated. In this case, therefore, it is required to appropriately control the diffusion distance or diffusion amount.

What is claimed is:

1. A multilayer ceramic substrate comprising a plurality of stacked glass ceramic layers and internal conductors,
   wherein at part of the internal conductors, at least regions of the glass ceramic layers around the internal conductors contain at least one diffusion element which is selected from the group consisting of Ti, Zr and Mn and which has a content larger at the regions of the glass ceramic layers around the internal conductors than that at different regions of the glass ceramic layers,
   wherein the regions of the glass ceramic layers around the internal conductors containing the at least one diffusion element have a distance of 100 μm or less from the internal conductors, and
   wherein the content of the at least one diffusion element at the regions is in a range of 0.1 mass % to 50 mass % in terms of an oxide.

2. A multilayer ceramic substrate according to claim 1, wherein the internal conductors contain Ag as a conductive material.

3. A multilayer ceramic substrate according to claim 1, wherein the internal conductors comprise via-hole conductors.

4. A multilayer ceramic substrate according to claim 1, wherein the multilayer ceramic substrate is fabricated through a shrinkage-suppressing process.

* * * * *